United States Patent
Patukuri et al.

(10) Patent No.: US 10,985,769 B2
(45) Date of Patent: *Apr. 20, 2021

(54) TRANSCEIVER WITH IN-PHASE AND QUADRATURE-PHASE COUPLING CORRECTION

(71) Applicant: TEXAS INSTRUMENTS INCORPORATED, Dallas, TX (US)

(72) Inventors: Raja Reddy Patukuri, Nizamabad (IN); Jagannathan Venkataraman, Bengaluru (IN); Shagun Dusad, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/828,149

(22) Filed: Mar. 24, 2020

(65) Prior Publication Data

US 2020/0228127 A1 Jul. 16, 2020

Related U.S. Application Data

(63) Continuation of application No. 16/265,219, filed on Feb. 1, 2019, now Pat. No. 10,637,491.

(60) Provisional application No. 62/786,013, filed on Dec. 28, 2018.

(51) Int. Cl.
*H03M 1/08* (2006.01)
*H04B 1/40* (2015.01)
*H03M 1/10* (2006.01)

(52) U.S. Cl.
CPC ....... *H03M 1/0836* (2013.01); *H03M 1/1014* (2013.01); *H04B 1/40* (2013.01)

(58) Field of Classification Search
CPC . H04B 1/30; H04B 17/21; H04B 1/40; H03D 3/009; H03M 1/0836; H03M 1/1014
See application file for complete search history.

(56) References Cited

U.S. PATENT DOCUMENTS

| | | | |
|---|---|---|---|
| 10,637,491 B1* | 4/2020 | Patukuri | H03M 1/0836 |
| 2006/0178125 A1* | 8/2006 | Chae | H04B 1/30 455/323 |
| 2008/0130800 A1* | 6/2008 | Maxim | H03C 3/40 375/345 |
| 2008/0159442 A1* | 7/2008 | Tanabe | H04L 27/3863 375/324 |
| 2010/0329397 A1* | 12/2010 | Kim | H04L 27/3863 375/345 |
| 2011/0090107 A1* | 4/2011 | Mujica | H03M 1/004 341/155 |
| 2012/0189318 A1* | 7/2012 | Mo | H04B 10/697 398/152 |

* cited by examiner

*Primary Examiner* — Sung S Ahn
(74) *Attorney, Agent, or Firm* — Ray A. King; Charles A. Brill; Frank D. Cimino

(57) ABSTRACT

A transceiver system includes a clock generator and an analog-to-digital circuit (ADC). The transceiver system also includes a coupling correction circuit coupled to the clock generator and to the ADC, wherein the coupling correction circuit is configured to provide an in-phase correction and a quadrature-phase correction to a signal received by the ADC.

14 Claims, 5 Drawing Sheets

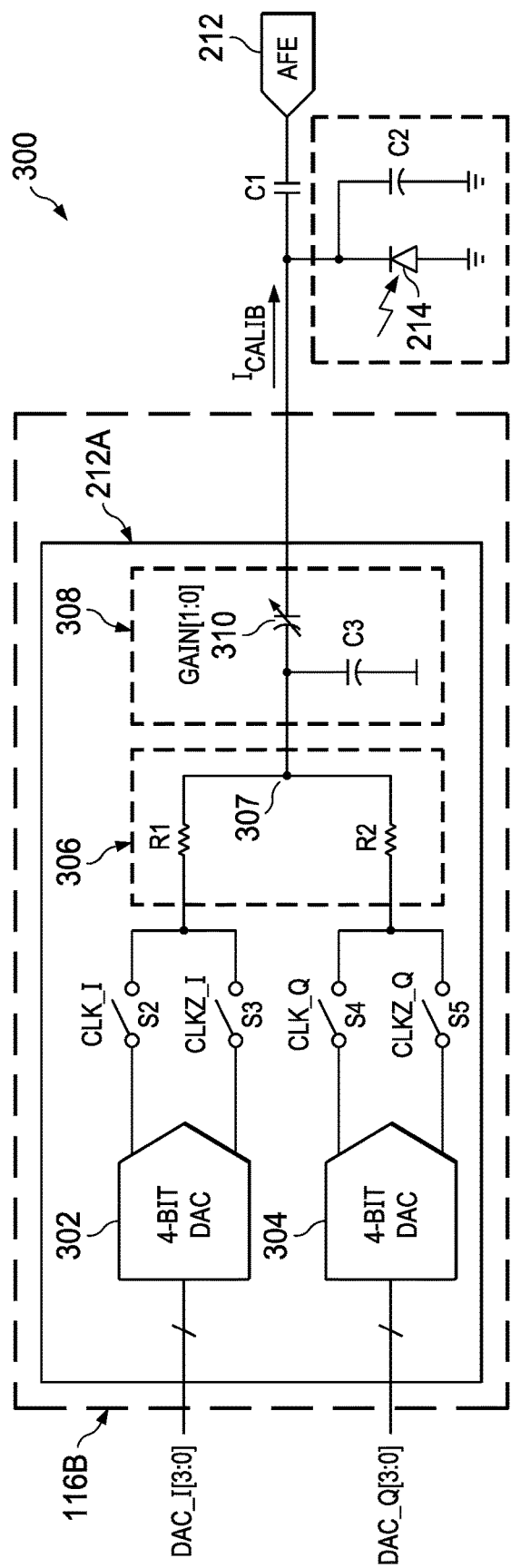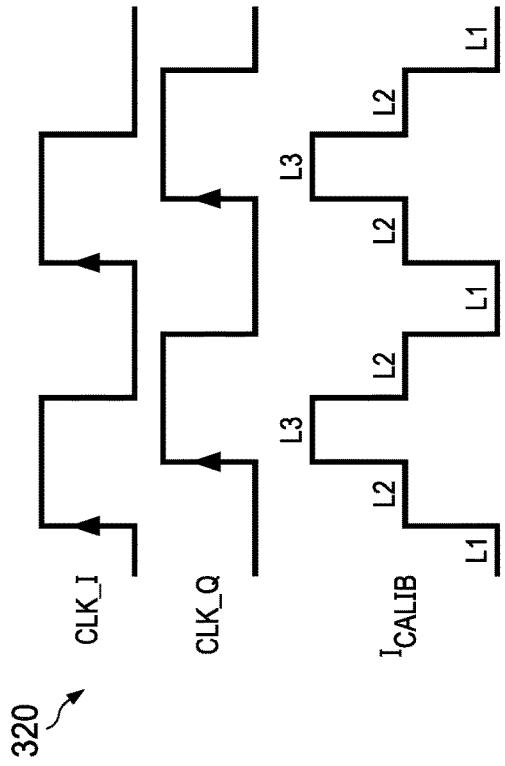
FIG. 3A
FIG. 3B

US 10,985,769 B2

1

TRANSCEIVER WITH IN-PHASE AND QUADRATURE-PHASE COUPLING CORRECTION

CROSS-REFERENCE TO RELATED APPLICATION

This continuation application claims priority to U.S. application Ser. No. 16/265,219, filed Feb. 1, 2019, which application claims priority to and the benefit of U.S. Provisional Application No. 62/786,013, filed Dec. 28, 2018, both of which are hereby incorporated herein in their entirety.

BACKGROUND

Modern electronics involve networked devices that transmit data, receive data, or both. An example transceiver includes both transmitter and receiver components. Example transmitter components provide an encoded data signal for a communication channel based on a transmitter clock signal. Likewise, example receiver components sample and decode a received signal from a communication channel based on a receiver clock signal. One issue that reduces the dynamic range (the bandwidth) of transmitters and receivers is coupling between components and/or communication lines.

SUMMARY

In accordance with at least one example of the disclosure, a transceiver system comprises a clock generator and an analog-to-digital circuit (ADC) coupled to the input node. The transceiver system also comprises a coupling correction circuit coupled to the clock generator and to the ADC. The coupling correction circuit is configured to provide an in-phase correction and a quadrature-phase correction to a signal received by the ADC.

In accordance with at least one example of the disclosure, an integrated circuit comprises a clock generator and an ADC. The integrated circuit also comprises a coupling correction circuit coupled to the clock generator and to the ADC. The coupling correction circuit is configured to adjust a sampling clock frequency for the ADC based on an in-phase correction and a quadrature-phase correction.

BRIEF DESCRIPTION OF THE DRAWINGS

For a detailed description of various examples, reference will now be made to the accompanying drawings in which:

FIG. 3A is a schematic diagram showing a coupling correction scenario in accordance with various examples;

FIG. 3B is a timing diagram showing signals related to the coupling correction scenario of FIG. 3A in accordance with various examples;

DETAILED DESCRIPTION

Disclosed herein are transceiver devices, systems, and methods involving a coupling correction circuit coupled to

2 an analog-to-digital circuit (ADC) and a clock generator. In operation, the coupling correction circuit is configured to provide an in-phase (I-phase) correction and a quadrature-phase (Q-phase) correction to a signal received by the ADC. In one example, the signal received by the ADC and corrected by the coupling correction circuit is an analog input signal to the ADC, where the I-phase correction and the Q-phase correction are applied to correct additive spurs in the analog input signal. In another example, the signal corrected by the coupling correction circuit is an ADC clock signal used for sampling, where the I-phase correction and the Q-phase correction are applied to ADC clock to correct multiplicative spurs. With the disclosed coupling correction circuit options, transceiver issues such as crosstalk and/or multiplicative jitter are reduced.

In some examples, coupling correction involves use of the I-phase and Q-phase of an unwanted signal (e.g., a transmitter clock) to correct crosstalk between a transmitter and a receiver. In one example, a coupling correction circuit employs a calibration current source circuit with digital-to-analog converters (DACs) for both I-phase and Q-phase signals to generate a correction signal for an ADC input, where the correction signal has a target amplitude and phase determined by the DACs.

In some examples, coupling correction based on the coupling correction circuit 116C involves use of f_samp/N I-phase and f_samp/N Q-phase to cancel delay/jitter introduced from f_samp/N digital switching coupling to an f_samp clock (e.g., from the clock generator 114A). In one example, inverter delay in a sampling clock path is modified using a f_samp/N vector generated using I-phase and Q-phase components of the f_samp/N clock signal. Note: "F_SAMP" in the figures is the same as "f_samp" in the specification. In some examples, automatic crosstalk calibration and/or automatic delay/jitter calibration is performed using digital estimation and a correction loop. Example corrections involve a one-time trim, a power-up calibration, and/or a background calibration. To provide a better understanding, various transceiver options and coupling correction circuit options are described using the figures as follows.

Figure 1:
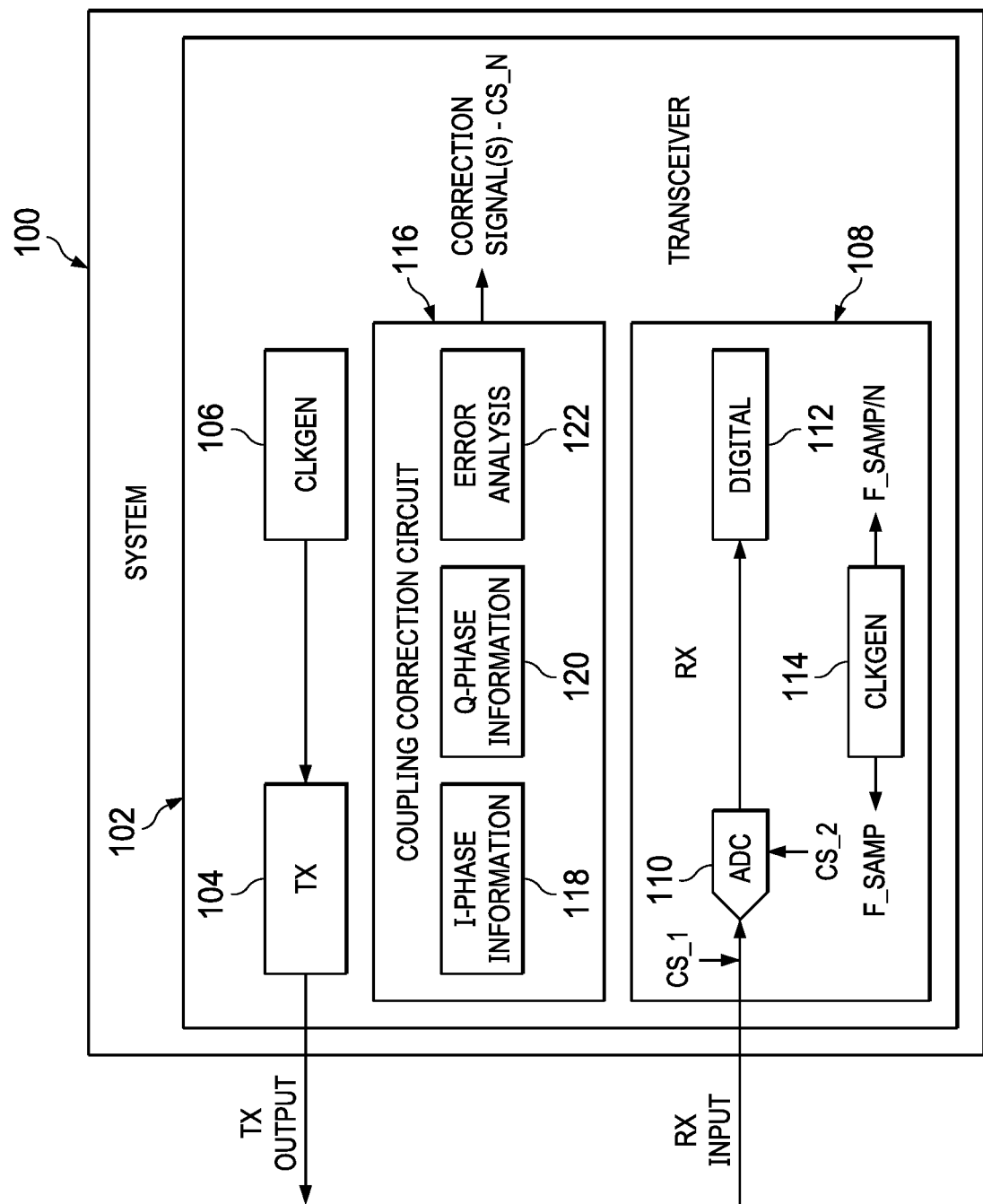
FIG. 1 is a block diagram showing a system in accordance with various examples.

FIG. 1 is a block diagram showing a system 100 in accordance with various examples. In some examples, the system 100 represents an electronic device or consumer product configured to send or receive data via a communication channel (e.g., an optical communication channel, a wired communication channel, or a wireless communication channel). In other examples, the system 100 represents an integrated circuit (system on a chip), or a combination of integrated circuit components and discrete components. As shown in FIG. 1, the system 100 comprises a transceiver 102 with a transmitter 104 and a receiver 108. The transmitter 104 is coupled to a clock generator 106 (CLKGEN) and is configured to provide a transmitter output based on a clock signal from the clock generator 106. The transceiver 102 also comprises a receiver 108 with an ADC 110 and digital components 112 coupled to the ADC 110, where the digital components 112 are used to modify the received signal, store the received signal, and/or other operations. In some examples, the receiver 108 also includes a clock generator 114, where the clock generator 114 provides a sampling clock frequency (f_samp) and a reduced frequency (f_samp/N).

As represented in FIG. 1, the transceiver 102 also includes a coupling correction circuit 116 configured to provide correction signal(s) (labeled CS_N, where N varies in different examples). In accordance with some examples, the coupling correction circuit 116 uses I-phase information 118 and Q-phase information 120 to provide CS_N. In some examples, the I-phase information 118 and Q-phase information 120 are provided by one of the clock generators 106 and 114. In different examples, the coupling correction circuit 116 also includes an error analysis circuit 122, where error analysis results from the error analysis circuit 122, the I-phase information 118, and the Q-phase information 120 are used to provide the CS_N. In one example, the error analysis circuit 122 determines a crosstalk estimate (an additive spur). In another example, the error analysis circuit 122 determines a multiplicate jitter estimate (a multiplicative spur). In other examples, the error analysis circuit 122 measures crosstalk and/or multiplicative jitter. In other examples, the error analysis circuit 122 performs trial-and-error analysis. In an example trial-and-error operation, an initial coupling correction is applied and a subsequent analysis determines whether the coupling correction should be adjusted up or down. As desired, error analysis operations of the error analysis circuit 122 is performed once or is performed periodically to adjust coupling correction operations.

In some examples, the coupling correction circuit 116 provides a correction signal, CS_1, to an analog input signal received by the ADC 110. In the example of FIG. 1, CS_1 corresponds to an additive spur correction applied to an input of the ADC 110 (e.g., a calibration current is applied to the input of the ADC 110). In other examples, a correction signal is applied to an output of the ADC 110. Additionally or alternatively, the coupling correction circuit 116 provides a correction signal, CS_2, which corresponds to a multiplicative spur correction for the ADC 110 (e.g., CS_2 is a corrected version of f_samp and is applied to the ADC 110).

Figure 2:
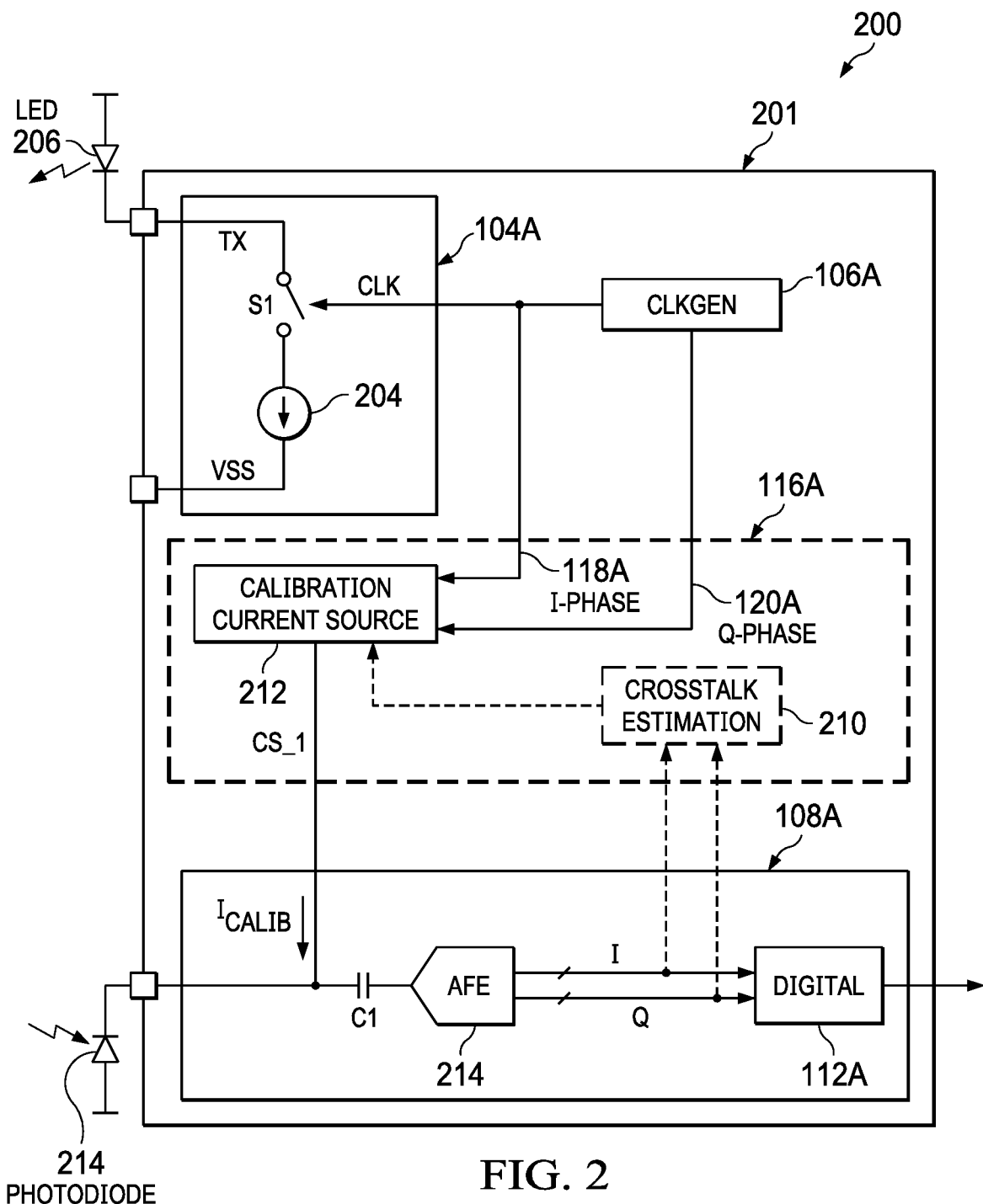
FIG. 2 is a block diagram showing a transceiver scenario in accordance with various examples.

FIG. 2 is a block diagram showing a transceiver scenario 200 in accordance with various examples. As shown, the transceiver scenario 200 includes a transceiver device 201 (e.g., the transceiver 102 of FIG. 1) with a transmitter 104A (an example of the transmitter 104 in FIG. 1) coupled to a light-emitting diode (LED) 206. The LED 206 provides an optical signal to an optical waveguide (not shown). The transceiver device 201 also includes a receiver 108A (an example of the receiver 108 in FIG. 1) that receives an input signal from a photodiode 214 that converts optical signals from an optical waveguide (not shown) into electrical signals. In other words, the transceiver scenario 200 employs the transceiver device 201 in an optical network scenario. In other examples, the transceiver device 201 is employed in a wired or wireless network scenario. In different examples, the transceiver device 201 corresponds to an integrated circuit, a chip, a multi-die module, or a printed circuit board (PCB) with integrated circuit components and/or discrete components.

As shown in the example of FIG. 2, the transmitter 104A of the transceiver device 201 includes a switch, S1, controlled by a clock signal (CLK) provided by a clock generator 106A (an example of the clock generator 106). When S1 is closed, a current source 204 of the transmitter 104A is coupled to the LED 206. When S1 is open, the current source 204 is uncoupled from the LED 206.

As shown in the example of FIG. 2, the receiver 108A of the transceiver device 201 includes a capacitor, C1, where a first terminal of C1 is coupled to the photodiode 214. The receiver 108A also includes an analog front end (AFE) circuit 214 coupled to a second terminal of C1 and configured to condition the received signal. The output of the analog front circuit 214 is provided to digital components 112A (an example of the digital components 112 in FIG. 1).

In FIG. 2, the transceiver 201 also includes a coupling correction circuit 116A (an example of the coupling correction circuit 116 in FIG. 1). As shown, the coupling correction circuit 116A includes a crosstalk estimation block 210 (an example of the error analysis circuit 122 in FIG. 1) coupled to the I-phase and Q-phase outputs of the AFE circuit 214. In some examples, crosstalk estimation is performed by the crosstalk estimation block 210 by comparing a first set of I-phase and Q-phase signals obtained from the AFE circuit 214 when the LED 206 is blocked and a second set of I-phase and Q-phase signals obtained from the AFE circuit 214 when the LED 206 is not blocked. As shown, the coupling correction circuit 116A also includes a calibration current source circuit 212 that receives the crosstalk estimate result from the crosstalk estimation circuit 210. The calibration current source circuit 212 also receives an I-phase signal 118A and a Q-phase signal 1186 from the clock generator 106A. Using the crosstalk estimate, the I-phase clock signal 118A, and the Q-phase clock signal 118B, the calibration current source 212 provides a calibration current ($I_{calib}$) to adjust the input signal for the receiver 108A such that crosstalk is accounted for (e.g., I-phase crosstalk and Q-phase crosstalk are subtracted from the input signal to the receiver 108A). In FIG. 2, $I_{calib}$ is an example of CS_1 in FIG. 1.

FIG. 3A is a schematic diagram showing a coupling correction scenario in accordance with various examples. In the coupling correction scenario 300, a coupling correction circuit 116B (an example of the correction calibration circuit 116 in FIG. 1, or the correction calibration circuit 116A in FIG. 2) includes a calibration current source circuit 212A (an example of the calibration current source circuit 212 in FIG. 2) configured to provide a calibration current ($I_{calib}$) to the signal output by the photodiode 214. In the coupling correction scenario 300 of FIG. 3A, the photodiode 214 outputs a signal as a function of light received from an optical waveguide (not shown). The signal from the photodiode 214 is stored by a capacitor, C2, and is conveyed to receiver components introduced in FIG. 2, such as C1 and AFE 212. In FIG. 3A, $I_{calib}$ is an example of CS_1 in FIG. 1, and is an example of $I_{calib}$ in FIG. 2. In other examples, $I_{calib}$ is used to adjust the input signal for a wired network receiver or the input signal for a wireless network receiver (e.g., before or after an ADC).

As shown, the calibration current source circuit 212A of FIG. 3A includes a first 4-bit DAC 302 and a second 4-bit DAC 304. The first 4-bit DAC 302 receives a first DAC control signal (DAC_I[3:0]) to provide an I-phase correction. Meanwhile, the second 4-bit DAC 304 receives a second DAC control signal (DAC_Q[3:0]) to provide Q-phase correction. In FIG. 3A, DAC_I[3:0] is an example of the I-phase signal 118A, and DAC_Q[3:0] is an example of the Q-phase signal 1186 in FIG. 2. The two outputs of the first 4-bit DAC 302 and the two outputs of the second 4-bit DAC 304 are provided to a resistive network 306 that includes resistors R1 and R2. More specifically, two outputs of the first 4-bit DAC 302 are coupled to R1 through respective switches, S2 and S3. As shown, S2 is controlled by a control signal, CLK_I, and S3 is controlled by a control signal, CLKZ_I. Also, the two outputs of the second 4-bit DAC 304 are coupled to R2 through respective switches, S4 and S5. As shown, S4 is controlled by a control signal, CLK_Q, and S5 is controlled by a control signal, CLKZ_Q. For the coupling correction scenario 300, CLK_Q is offset from CLK_I by 90 degrees. Also, CLKZ_I is the opposite of CLK_I (when CLK_I is high, CLKZ_I is low; and when CLK_I is low, CLKZ_I is high). Also, CLKZ_Q is the opposite of CLK_Q (when CLK_Q is high, CLKZ_Q is low; and when CLK_Q is low, CLKZ_Q is high). The signals through R1 and R2 are combined at node 307, and the combination signal is stored by a capacitor, C3. Also, a gain is applied to the combination signal by a gain component 310 (e.g., a DAC with a DAC capacitor, C_DAC) based on a control signal (Gain[1:0]). The output of the gain component 310 is $I_{calib}$ and is applied to the signal output from the photodiode 214. In one example, R1 and R2 have a value 100 KΩ, C_DAC has a value of 50 fF, and C3 has a value of 10 pF. In other examples, the values of R1, R2, C_DAC, and C3 vary.

In the coupling correction scenario 300 of FIG. 3A, coupling correction involves I and Q channel, and a 4-bit DAC for each channel. Also, in some examples, coupling correction such as the coupling correction scenario 300 of FIG. 3A involves a least-significant bit (LSB) of +/−0.5 nA. Also, in some examples, coupling correction such as the coupling correction scenario 300 of FIG. 3A involves independently inverting the I and Q clocks used (e.g., CLK_I is inverted to CLKZ_I, and CLK_Q is inverted to CLKZ_Q independently of each other). Also, in some examples, coupling correction such as the coupling correction scenario 300 of FIG. 3A involves 2-bit gain control. Also, in some examples, coupling correction such as the coupling correction scenario 300 of FIG. 3A involves providing a calibration current based on:

$$I_{calib} = \left[\frac{V_{DAC\_I}}{R1} + j \times \frac{V_{DAC\_Q}}{R2}\right] \times \frac{C\_DAC}{C1} \quad \text{Equation (1)}$$

In some examples, coupling correction such as the coupling correction scenario 300 involves use of the I-phase and Q-phase of an unwanted signal (e.g., a transmitter clock) to correct crosstalk between a transmitter and a receiver. In one example, coupling correction such as the coupling correction scenario 300 involves a calibration current source circuit (e.g., the calibration current source circuit 212A) with DACs (e.g., DACs 302 and 304) for both I-phase and Q-phase signals to generate a correction signal for an ADC input, where the correction signal has a target amplitude and phase determined by the DACs. In some examples, coupling correction such as the coupling correction scenario 300 involves automatic crosstalk calibration performed using digital estimation and a correction loop. Example corrections involve a one-time trim, a power-up calibration, and/or a dynamic calibration.

FIG. 3B is a timing diagram 320 showing signals related to the coupling correction scenario 300 of FIG. 3A in accordance with various examples. As shown, $I_{calib}$ varies as a function of CLK_I and CLK_Q. More specifically, $I_{calib}$ is at a first level (L1) when CLK_I and CLK_Q are both low. Also, $I_{calib}$ is at a second level (L2) when CLK_I is high and CLK_Q is low, or when CLK_I is low and CLK_Q is high. Also, $I_{calib}$ is at a third level (L3) when both CLK_I and CLK_Q are high. As desired, CLK_I and CLK_Q can be adjusted to vary the pattern for $I_{calib}$.

Figure 4A:
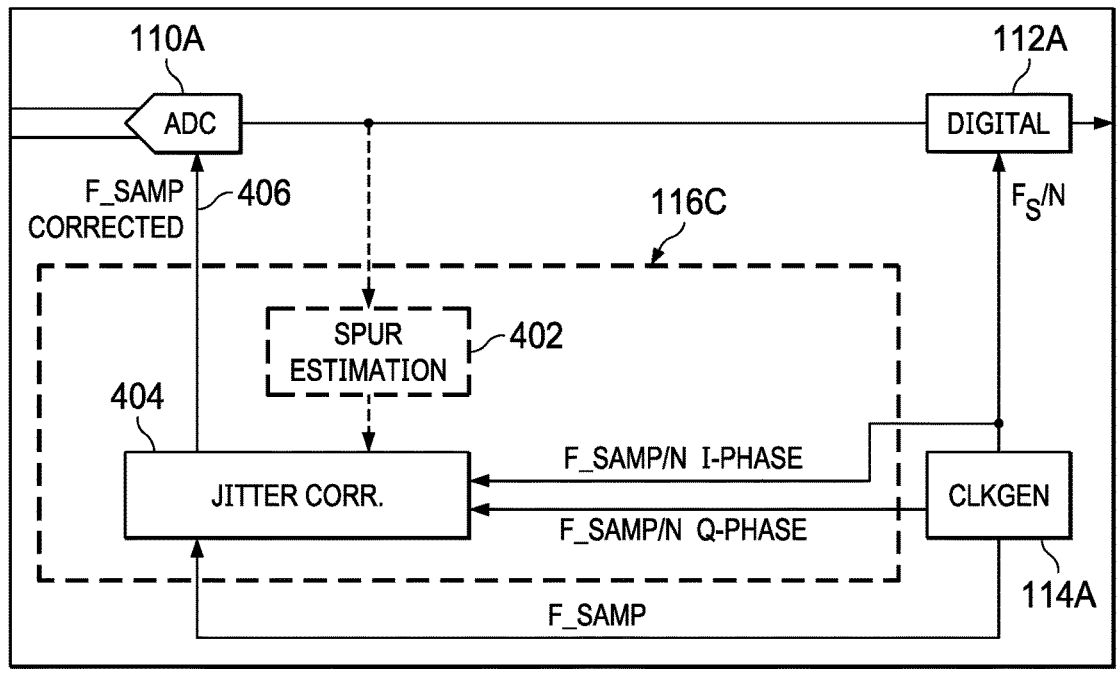
FIG. 4A is a block diagram showing a receiver in accordance with various examples.

FIG. 4A is a block diagram showing a receiver 400 in accordance with various examples. The receiver 400 of FIG. 4A is an example of the receiver 108 in FIG. 1. As shown, the receiver 400 includes an ADC 110A (an example of the ADC 110 in FIG. 1) and digital components 112A (an example of the digital components 112 in FIG. 1). The receiver 400 also includes a clock generator 114A (an example of the clock generator 114 in FIG. 1).

In the example of FIG. 4A, the receiver 400 also includes a coupling correction circuit 116C (an example of the coupling correction circuit 116 in FIG. 1). As shown, the coupling correction circuit 116C includes a spur estimation circuit 402 (an example of the error analysis circuit 122 in FIG. 1) that estimates a spur (a sampling frequency spur) in the output of the ADC 110A. The coupling correction circuit 116C also includes a jitter correction circuit 404 configured to provide a corrected sampling frequency to the ADC 110A based on an output of the spur estimation circuit 402. The jitter correction circuit 404 also receives an I-phase signal (f_samp/N I-phase), a Q-phase signal (f_samp/N Q-phase), and a sampling frequency (f_samp) from the clock generator 114A. Based on the spur estimation, the I-phase signal, the Q-signal, and the sampling frequency, the jitter correction circuit 404 provides a corrected sampling frequency to the ADC 110A via a sampling clock path 406, where the ADC 110A uses the corrected sampling frequency to reduce or eliminate spurs in the signal provided to the digital components 112A.

Figure 4B:
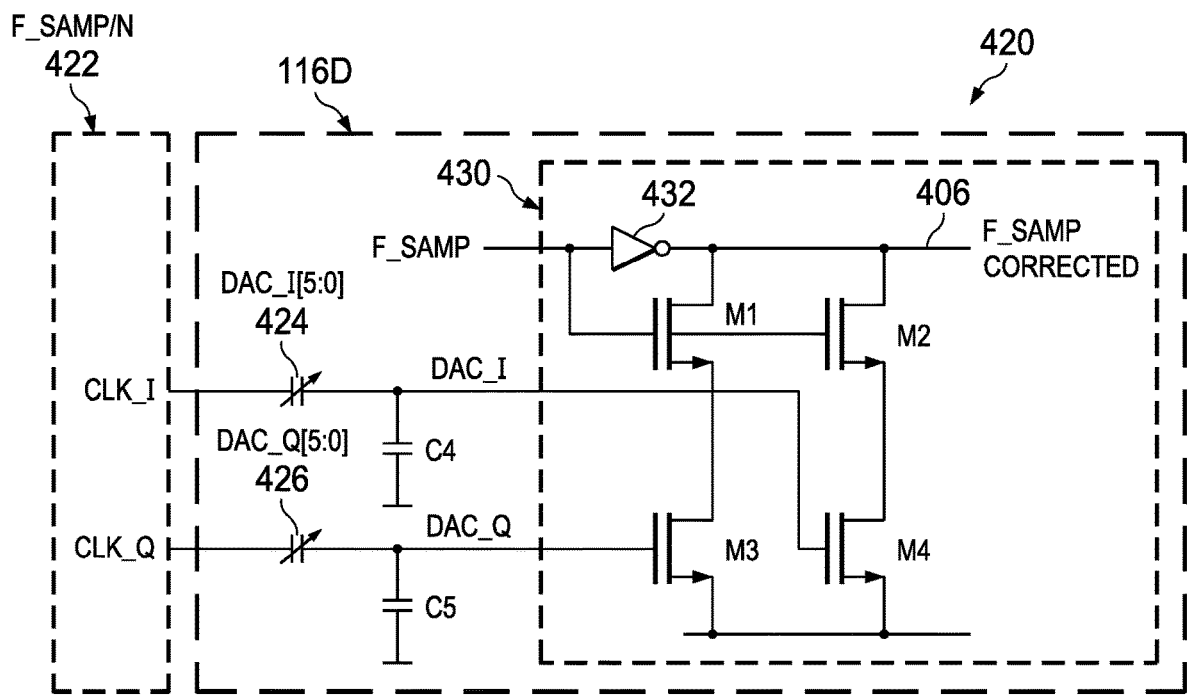
FIG. 4B is a schematic diagram showing another coupling correction scenario in accordance with various examples.

FIG. 4B is a schematic diagram showing another coupling correction scenario 420 in accordance with various examples. In the coupling correction scenario 420, a coupling correction circuit 116D is represented. In some examples, the coupling correction circuit 116D of FIG. 4B is an example of the coupling correction circuit 116 in FIG. 1, or the coupling correction circuit 116C in FIG. 4A. As shown in the coupling correction scenario 420, the coupling correction circuit 116D receives I-phase information (DAC_I[5:0]) and Q-phase information (DAC_Q[5:0]) from a clock generator 422 (an example of the clock generator 114 in FIG. 1, or the clock generator 114A in FIG. 4A). In some examples, DAC_I[5:0] corresponds to the f_samp/N I-phase signal in FIG. 4A, and DAC_Q[5:0] corresponds to the f_samp/N Q-phase signal in FIG. 4A. In some examples, DAC_I[5:0] is used to control the signal output by a DAC 424, where C4 stores the charge from the DAC 424. As shown, the output of the DAC 424 (labeled "DAC_I") is applied as a gate drive signal to a transistor, M4, of a delay circuit 430 of the coupling correction circuit 116D. Meanwhile, DAC_Q[5:0] is used to control the signal output by a DAC 426, where C5 stores the charge from the DAC 426. As shown, the output of the DAC 426 (labeled "DAC_Q") is applied as a gate drive signal to a transistor, M3, of the delay circuit 430 of the coupling correction circuit 116D.

In FIG. 4B, the delay circuit 430 also includes an inverter 432 that receives a sampling frequency (f_samp) at its input. The sampling frequency (f_samp) is also applied as a gate control signal to two other transistors, M1 and M2, of the delay circuit 430 of the coupling correction circuit 116D. In operation, the coupling correction circuit 116D outputs a corrected sampling frequency (f_samp corrected) by adjusting the delay of the sampling clock path 406 based on the DAC_I and DAC_Q signals.

In some examples, coupling correction such as the coupling correction scenario 420 of FIG. 4B involves use of f_samp/N I-phase and f_samp/N Q-phase to cancel delay/jitter introduced from f_samp N digital switching coupling to an f_samp clock (e.g., from the clock generator 114A). In some examples, coupling correction such as the coupling correction scenario 420 of FIG. 4B involves modifying inverter delay in a sampling clock path using a f_samp/N vector generated using I-phase and Q-phase components of the f_samp/N clock signal. In some examples, automatic delay/jitter calibration is performed using digital estimation and a correction loop. Example corrections involve a one-time trim, a power-up calibration, and/or a dynamic calibration.

Figure 5:
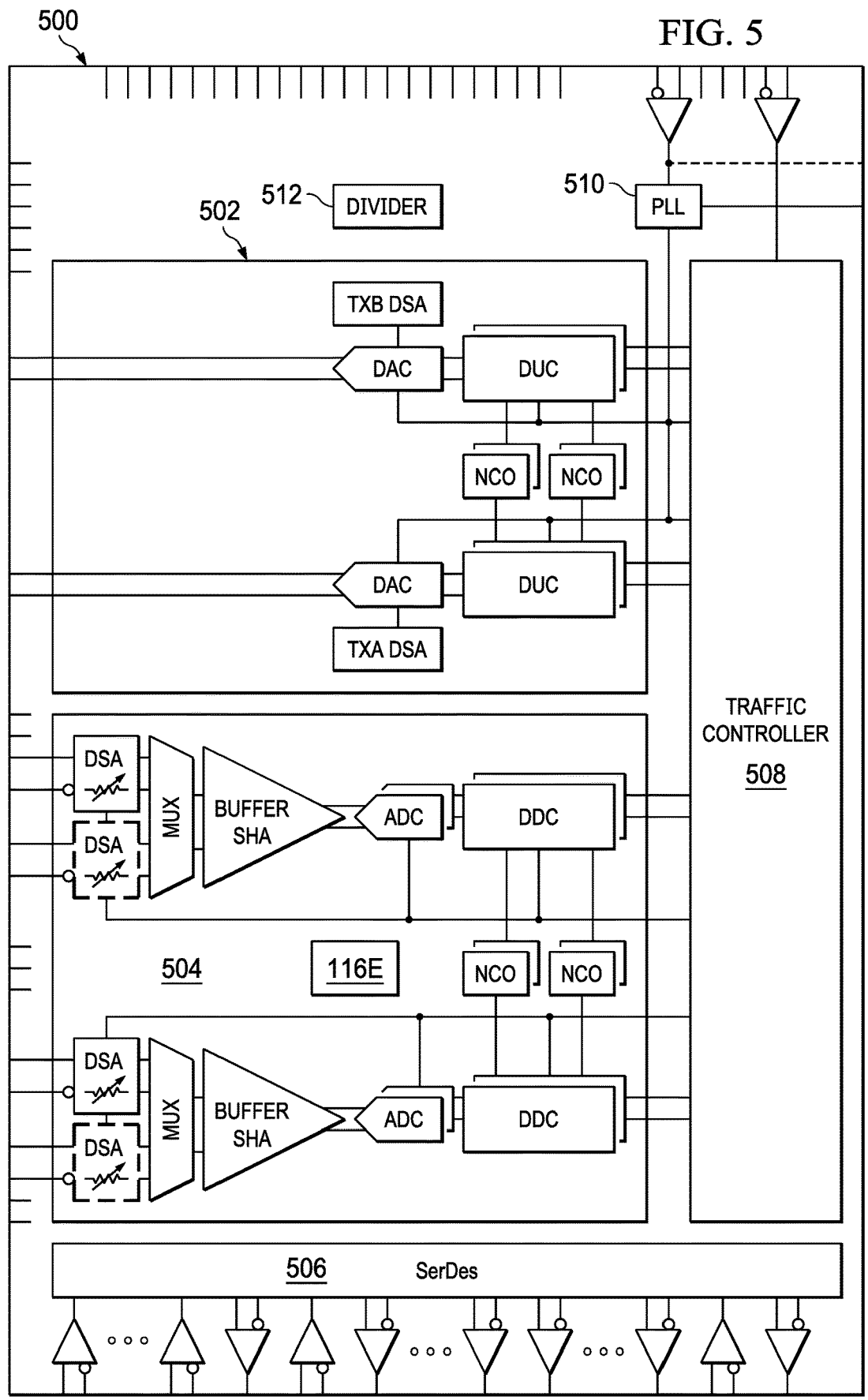
FIG. 5 is a block diagram showing part of a transceiver device in accordance with various examples.

FIG. 5 is a block diagram showing part of a transceiver device 500 in accordance with various examples. In different examples, the transceiver device 500 corresponds to an integrated circuit, a chip, a multi-die module, and/or a combination of integrated circuit components and discrete components. In FIG. 5, the transceiver device 500 includes a transmitter block 502, and a receiver block 504. As shown, the transmitter block 502 includes components such as DACs, digital up converters (DUCs), numerically controlled oscillators (NCOs), and digital step attenuation (DSA) components. Meanwhile, the receiver block 504 includes components such as DSA components, multiplexers, buffers, ADCs, digital down converters (DDCs), NCOs. Also, the receiver block 504 includes a coupling correction circuit 116E. In different examples, the coupling correction circuit 116E is an example of the coupling correction circuit 116 of FIG. 1, the coupling correction circuit 116A of FIG. 2, the coupling correction circuit 116B of FIG. 3A, the coupling correction circuit 116C of FIG. 4A, or the coupling correction circuit 116D of FIG. 4B. In some examples, the transceiver device 500 also includes components such as a serializer/deserializer 506, a traffic controller 508, a phase-locked loop 510, a divider 512, buffers, and/or other components.

The transceiver device 500 is only an example, and is not intended to limit use of the coupling correction circuit 116E to a particular transceiver device. In different examples, the coupling correction circuit 116E is used with single channel or multi-channel transceiver devices for optical communication channels, single channel or multi-channel transceiver devices for wired communication channels, and single channel or multi-channel transceiver devices for wireless communication channels.

In different examples, a transceiver system or device includes a transceiver (e.g., the transceiver 102 of FIG. 1, the transceiver 201 of FIG. 1, or the transceiver device 500 of FIG. 5) with an ADC (e.g., the ADC 110 in FIG. 1, the ADC 110A in FIG. 4A, or the ADCs in FIG. 5) and a clock generator (e.g., the clock generator 106 in FIG. 1, the clock generator 114 in FIG. 1, the clock generator 106A in FIG. 2, or the clock generator 114A in FIG. 4A). A transceiver system or device also includes a coupling correction circuit (e.g., the coupling correction circuit 116 in FIG. 1, the coupling correction circuit 116A in FIG. 2, the coupling correction circuit 116B in FIG. 3A, the coupling correction circuit 116C in FIG. 4A, the coupling correction circuit 116D in FIG. 4B, or the coupling correction circuit 116E in FIG. 5) coupled to the clock generator and to the ADC, wherein the coupling correction circuit is configured to provide an I-phase correction and a Q-phase correction to a signal received by the ADC. In some examples, a coupling correction circuit is configured to receive an I-phase clock signal (e.g., the I-phase signal 118A in FIG. 2, the f_samp/N I-phase signal in FIG. 4A, or DAC_I[5:0] in FIG. 4B) and a Q-phase clock signal (e.g., the Q-phase signal 118B in FIG. 2, the f_samp/N Q-phase signal in FIG. 4A, or DAC_Q[5:0] in FIG. 4B) from the clock generator. The coupling correction circuit is configured provide an I-phase correction and a Q-phase correction based on the I-phase clock signal and the Q-phase clock signal.

In some examples, a coupling correction circuit (e.g., the coupling correction circuit 116 in FIG. 1, the coupling correction circuit 116A in FIG. 2, the coupling correction circuit 116B in FIG. 3A, the coupling correction circuit 116C in FIG. 4A, the coupling correction circuit 116D in FIG. 4B, or the coupling correction circuit 116E in FIG. 5) is configured to provide the I-phase correction and the Q-phase correction based on a trial-and-error analysis process. Additionally or alternatively, a coupling correction circuit is configured to provide the I-phase correction and the Q-phase correction based on a crosstalk measurement or estimate.

In some examples, a coupling correction circuit (e.g., the coupling correction circuit 116 in FIG. 1, the coupling correction circuit 116A in FIG. 2, the coupling correction circuit 116B in FIG. 3A, the coupling correction circuit 116C in FIG. 4A, the coupling correction circuit 116D in FIG. 4B, or the coupling correction circuit 116E in FIG. 5) comprises a first DAC (e.g., the first 4-bit DAC 302 in FIG. 3A, or the DAC 424 in FIG. 4A) configured to provide scaling of the I-phase correction based on a first DAC control signal (e.g., DAC_I[3:0] in FIG. 3A, or DAC_I[5:0] in FIG. 4B). The coupling correction circuit also includes a second DAC (e.g., the second 4-bit DAC 304 in FIG. 3A, or the DAC 426 in FIG. 4A) configured to provide scaling of the Q-phase correction based on a second DAC control signal (e.g., DAC_Q[3:0] in FIG. 3A, or DAC_Q[5:0] in FIG. 4B).

In some examples, a coupling correction circuit (e.g., the coupling correction circuit 116 in FIG. 1, the coupling correction circuit 116A in FIG. 2, the coupling correction circuit 116B in FIG. 3A, or the coupling correction circuit 116E in FIG. 5) comprises a crosstalk estimation circuit (e.g., the crosstalk estimation circuit 210 of FIG. 2) configured to receive an output an analog front end (AFE) and to provide the crosstalk estimate to a calibration current source circuit (e.g., the calibration current source circuit 212 of FIG. 2, or the calibration current source circuit 212A of FIG. 3A). In some examples, the coupling correction circuit comprises at least one switch (e.g., S2 in FIG. 3A) controlled by the I-phase clock signal (e.g., CLK_I in FIG. 3A) and at least one switch (e.g., S4 in FIG. 3A) controlled by the Q-phase clock signal (e.g., CLK_Q in FIG. 3A). Also, in some examples, the coupling correction circuit comprises at least one switch (e.g., S3 in FIG. 3A) controlled by an inverse of the I-phase clock signal (e.g., CLKZ_I in FIG. 3A) and at least one switch (e.g., S5) controlled by an inverse of the Q-phase clock signal (e.g., CLKZ_Q in FIG. 3A).

In some examples, a coupling correction circuit (e.g., the coupling correction circuit 116 in FIG. 1, the coupling correction circuit 116A in FIG. 2, the coupling correction circuit 116B in FIG. 3A, or the coupling correction circuit 116E in FIG. 5) comprises a first resistor (e.g., R1 in FIG. 3A) selectively coupled to an output of a first DAC (e.g., the first 4-bit DAC 302 in FIG. 3A), and a second resistor (e.g., R2 in FIG. 3A) selectively coupled to an output of a second DAC (e.g., the second 4-bit DAC 304 in FIG. 3A). In some examples, the coupling correction circuit comprises a capacitor (e.g., C3 in FIG. 3A) with a first terminal and a second terminal, wherein the first terminal is coupled to the first resistor (e.g., R1 in FIG. 3A), the second resistor (e.g., R2 in FIG. 3A), and a gain adjustment component (e.g., the gain component 310 in FIG. 3A), and wherein the second terminal is coupled to a ground node.

In some examples, a coupling correction circuit (e.g., the coupling correction circuit 116 in FIG. 1, the coupling correction circuit 116C in FIG. 4A, the coupling correction circuit 116D in FIG. 4B, or the coupling correction circuit 116E in FIG. 5) is configured to adjust delay in a sampling clock path (e.g., the sampling clock path 406 in FIG. 4A)

based on the I-phase correction and the Q-phase correction, and wherein the sampling clock path is used to provide a sampling clock signal to an ADC (e.g., (e.g., the ADC 110 in FIG. 1, the ADC 110A in FIG. 4A, or the ADCs in FIG. 5). In some examples, the coupling correction circuit is configured to cancel ADC sampling frequency spurs based on the I-phase correction and the Q-phase correction (e.g., by using the I-phase correction and the Q-phase correction to adjust delay in a sampling frequency path).

In some examples, the coupling correction circuit (e.g., the coupling correction circuit 116 in FIG. 1, the coupling correction circuit 116A in FIG. 2, the coupling correction circuit 116B in FIG. 3A, or the coupling correction circuit 116E in FIG. 5) applies an I-phase correction and a Q-phase correction to an analog input signal received by the ADC to correct additive spurs. Additionally or alternatively, a coupling correction circuit (e.g., the coupling correction circuit 116 in FIG. 1, the coupling correction circuit 116C in FIG. 4A, the coupling correction circuit 116D in FIG. 4B, or the coupling correction circuit 116E in FIG. 5) applies the I-phase correction and the Q-phase correction to a sampling clock signal (e.g., f_samp corrected) received by the ADC to correct multiplicative spurs.

In some examples, a coupling correction circuit (e.g., the coupling correction circuit 116 in FIG. 1, the coupling correction circuit 116C in FIG. 4A, the coupling correction circuit 116D in FIG. 4B, or the coupling correction circuit 116E in FIG. 5) comprises a delay circuit (e.g., the delay circuit 430 of FIG. 4B) configured to adjust the sampling clock frequency, wherein a delay provided by the delay circuit is adjusted based on an I-phase correction and a Q-phase correction. In some examples, the delay circuit (e.g., the delay circuit 430 of FIG. 4B) comprises first and second transistors (e.g., M3 and M4 in FIG. 4B), each having a control terminal, a first current terminal, and a second current terminal, wherein the control terminal of the first transistor (e.g., M3 in FIG. 4B) is configured to receive a first control signal (e.g., DAC_I in FIG. 4B) based on an I-phase correction, and wherein the control terminal of the second transistor (e.g., M4 in FIG. 4B) is configured to receive a second control signal (e.g., DAC_Q in FIG. 4B) based on a Q-phase correction.

In some examples, the delay circuit (e.g., the delay circuit 430 in FIG. 4B) further comprises third and fourth transistors (e.g., M1 and M2 in FIG. 4B), each having a control terminal, a first current terminal, and a second current terminal, wherein the control terminal of the third and fourth transistors are coupled to a sampling frequency clock (e.g., f_samp in FIG. 4B), wherein a first current terminal of the third and fourth transistors are coupled to an inverter output, wherein a second current terminal of the third transistor (e.g., M1 in FIG. 4B) is coupled to a first current terminal of the first transistor (e.g., M3 in FIG. 4B), wherein a second current terminal of the fourth transistor (e.g., M2 in FIG. 4B) is coupled to a first current terminal of the second transistor (e.g., M4 in FIG. 4B), and wherein the second current terminals of the first and second transistors (e.g., M3 and M4 in FIG. 4B) are coupled to a ground node.

In some examples, the first control signal (e.g., DAC_I in FIG. 4A) is based on a reduced I-phase clock signal (e.g., f_samp/N I-phase in FIG. 4A) wherein the first control signal corresponds to a DAC control signal obtained using the reduced I-phase clock signal, and wherein the second control signal (e.g., DAC_Q in FIG. 4B) is based on a reduced Q-phase clock signal (e.g., f_samp/N Q-phase in FIG. 4A), and wherein the second control signal corresponds to a DAC control signal obtained using the reduced Q-phase clock signal.

In some examples, a coupling correction circuit (e.g., the coupling correction circuit 116 in FIG. 1, the coupling correction circuit 116A in FIG. 2, the coupling correction circuit 116B in FIG. 3A, or the coupling correction circuit 116E in FIG. 5) is configured to apply a correction to an input signal to the ADC based on the I-phase correction and the Q-phase correction. Additionally or alternatively, a coupling correction circuit (e.g., the coupling correction circuit 116 in FIG. 1, the coupling correction circuit 116A in FIG. 2, the coupling correction circuit 116B in FIG. 3A, or the coupling correction circuit 116E in FIG. 5) is configured to apply a correction to an output signal of the ADC based on the I-phase correction and the Q-phase correction.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A transceiver system, comprising:
    a clock generator;
    an analog-to-digital circuit (ADC);
    a coupling correction circuit coupled to the clock generator and to the ADC, wherein the coupling correction circuit is configured to provide an in-phase correction and a quadrature-phase correction to a signal provided to the ADC, the coupling correction circuit including:
        first and second transistors, each having a control terminal, a first current terminal, and a second current terminal, wherein the control terminal of the first transistor is configured to receive a first control signal based on the in-phase correction, and wherein the control terminal of the second transistor is configured to receive a second control signal based on the quadrature-phase correction; and
        third and fourth transistors, each having a control terminal, a first current terminal, and a second current terminal, wherein the control terminal of the third and fourth transistors are coupled to a sampling frequency clock, a first current terminal of the third transistor is coupled to a first current terminal of the first transistor, a first current terminal of the fourth transistor is coupled to a first current terminal of the second transistor, and the second current terminals of the first and second transistors are coupled to a ground reference.

2. The transceiver system of claim 1, wherein the coupling correction circuit is configured to receive an in-phase clock signal and a quadrature-phase clock signal from the clock generator, and wherein the coupling correction circuit is configured provide the in-phase correction and the quadrature-phase correction based on the in-phase clock signal and the quadrature-phase clock signal.

3. The transceiver system of claim 1, wherein the coupling correction circuit includes an error analysis circuit configured to provide the in-phase correction and the quadrature-phase correction based on a trial-and-error analysis process.

4. The transceiver system of claim 1, wherein the coupling correction circuit includes an error analysis circuit configured to provide the in-phase correction and the quadrature-phase correction based on a crosstalk measurement or estimate.

5. The transceiver system of claim 2, wherein the coupling correction circuit comprises at least one switch controlled by the in-phase clock signal and at least one switch controlled by the quadrature-phase clock signal.

6. The transceiver system of claim 1, wherein the coupling correction circuit is configured to adjust delay in a sampling clock path based on the in-phase correction and the quadrature-phase correction, and wherein the sampling clock path is used to provide a sampling clock signal to the ADC.

7. The transceiver system of claim 1, wherein coupling correction circuit is configured to cancel ADC multiplicative spurs based on the in-phase correction and the quadrature-phase correction.

8. The transceiver system of claim 1, wherein the in-phase correction and the quadrature-phase correction are applied to an analog input signal provided to the ADC.

9. The transceiver system of claim 1, wherein the in-phase correction and the quadrature-phase correction are applied to a sampling clock signal provided to the ADC.

10. An integrated circuit, comprising:
a clock generator;
an analog-to-digital circuit (ADC); and
a coupling correction circuit coupled to the clock generator and to the ADC, wherein the coupling correction circuit is configured to adjust a sampling clock frequency for the ADC based on an in-phase correction and a quadrature-phase correction, the coupling correction circuit including a delay circuit having:
first and second transistors, each having a control terminal, a first current terminal, and a second current terminal, wherein the control terminal of the first transistor is configured to receive a first control signal based on the in-phase correction, and wherein the control terminal of the second transistor is configured to receive a second control signal based on the quadrature-phase correction; and
third and fourth transistors, each having a control terminal, a first current terminal, and a second current terminal, wherein the control terminal of the third and fourth transistors are coupled to a sampling frequency clock, a first current terminal of the third transistor is coupled to a first current terminal of the first transistor, a first current terminal of the fourth transistor is coupled to a first current terminal of the second transistor, and the second current terminals of the first and second transistors are coupled to a ground reference.

11. The integrated circuit of claim 10, wherein the delay circuit is configured to adjust the sampling clock frequency.

12. The integrated circuit of claim 10, wherein the coupling correction circuit is also configured to apply a correction to an input signal to the ADC based on the in-phase correction and the quadrature-phase correction.

13. The integrated circuit of claim 10, wherein the coupling correction circuit is also configured to apply a correction to an output signal of the ADC based on the in-phase correction and the quadrature-phase correction.

14. The integrated circuit of claim 10, including an inverter having an input coupled to the control terminal of the third transistor, and an output coupled to second current terminals of the third and fourth transistors.

* * * * *